(12) United States Patent
Huang et al.

(10) Patent No.: US 7,431,364 B2
(45) Date of Patent: Oct. 7, 2008

(54) MICROGRIPPER DEVICE FOR A MICRO-MECHANISM

(75) Inventors: Shyh-Chour Huang, No. 57-1, Tien-Chin St., Sanmin Dist., Kaohsiung (TW); Chien-Ching Chiu, No. 114-25, Shih-Cheng Tsun, Ta-Nei Hsiang, Tainan Hsien (TW)

(73) Assignees: National Koasiung University of Applied Sciences, Kaohsiung (TW); Shyh-Chour Huang, Kaohsiung (TW); Chien-Ching Chiu, Shih-Cheng Tsun, Tainan Hsien (TW)

( * ) Notice: Subject to any disclaimer, the term of this patent is extended or adjusted under 35 U.S.C. 154(b) by 807 days.

(21) Appl. No.: 10/930,829

(22) Filed: Sep. 1, 2004

(65) Prior Publication Data

US 2006/0043749 A1    Mar. 2, 2006

(51) Int. Cl.
*B25J 7/00* (2006.01)

(52) U.S. Cl. .................. 294/99.1; 294/100; 901/36

(58) Field of Classification Search .................. 294/1.1, 294/86.4, 99.1, 100; 901/36; 977/962
See application file for complete search history.

(56) References Cited

U.S. PATENT DOCUMENTS

| | | | | |
|---|---|---|---|---|
| 4,540,211 A | * | 9/1985 | Masserang | 294/88 |
| 4,666,198 A | * | 5/1987 | Heiserman | 294/86.4 |
| 5,046,773 A | * | 9/1991 | Modesitt | 294/100 |
| 5,538,305 A | * | 7/1996 | Conway et al. | 294/119.1 |
| 5,727,915 A | * | 3/1998 | Suzuki | 414/1 |
| 5,895,084 A | * | 4/1999 | Mauro | 294/100 |
| 6,513,213 B1 | * | 2/2003 | Muramatsu et al. | 29/25.35 |
| 2005/0029827 A1 | * | 2/2005 | Hashiguchi et al. | 294/86.4 |

FOREIGN PATENT DOCUMENTS

JP    05-293778    *    9/1993

* cited by examiner

*Primary Examiner*—Dean J Kramer
(74) *Attorney, Agent, or Firm*—Muncy, Geissler, Olds, & Lowe PLLC

(57) ABSTRACT

A microgripper device includes a microactuator member and a microgripper member. The microactuator member includes an actuating portion adapted to output a driving force to the microgripper member. The microgripper member includes a main flame, an engaging portion, a pair of lateral shifting portions and a gripping portion. The main frame of the microgripper member mounts the microactuator member therein, and the engaging portion of the microgripper member connects to the actuating portion of the microactuating member. Each of the lateral shifting portions includes three connection portions linking the main frame, the engaging portion and the gripping respectively. The gripping portion of the microgripper member includes a pair of resilient arms and a pair of pivot portions. Each of the pivot portions connects to a first end of the corresponding resilient arm so that the second ends of the resilient arms are able to generate a gripping movement.

9 Claims, 3 Drawing Sheets

MICROGRIPPER DEVICE FOR A MICRO-MECHANISM

BACKGROUND OF THE INVENTION

1. Field of the Invention

The present invention relates to a microgripper device for a micro-mechanism. More particularly, the present invention relates to a microgripper device employed a microactuator member to directly actuate a microgripper member, thereby generating a mechanically micro-gripping operation of the microgripper member.

2. Description of the Related Art

U.S. Pat. No. 5,895,084, issued on Apr. 20, 1999 to Mauro, discloses a cam operated microgripper which includes a microgripper member and a motor member. The microgripper member is a pliers-like member consisting of a pair of resilient arms as a pair of forcepts-like component gripper arms. An end of each of resilient arms mounts to a support block while the other end of each of the resilient arms forming a component gripping tweezer-like structure. The resilient arms are leaf springs which are arranged in their relaxed condition to have the ends spaced apart in a desired manner. In operation, a gripping or releasing movement of the microgripper member is able to grip or release a very small object. However, the resilient arms of the microgripper must be operated by a stepper or servomotor through ramp cams, face cams or rotary cams.

U.S. Pat. No. 5,538,305, issued on Jul. 23, 1996 to Conway, also discloses a microgripper member and a servomotor member for gripping or releasing a very small object. The microgripper member includes a support and a pair of flexible arms. A pair of unmounted ends of the flexible arms is capable of being flexed toward and away from each other. In operation, the servo motor member through a gearbox drives a slide arrangement of the microgripper member. The slide arrangement is adapted to move the unmounted ends of the flexible arms toward or away, thereby providing a gripping or releasing movement. However, the flexible arms of the microgripper member must employ the servomotor and gearbox for a gripping or releasing movement.

Hence, there is a need for an improved power source, in addition to the servomotor disclosed in U.S. Pat. No. 5,895,084 and U.S. Pat. No. 5,538,305, for actuating the resilient arms of the microgripper member.

U.S. Pat. No. 5,727,915, issued on Mar. 17, 1998 to Suzuki, also discloses a microgripper system provided with a master input apparatus. The microgripper system includes a pair of flexible arms for gripping and releasing a very small object. The master input apparatus employs an electromagnetic generator to actuate the microgripper so that the flexible arms of the microgripper system are able to grip and release the very small object. However, there is also a need for an improved power source, in addition to the electromagnetic generator disclosed in U.S. Pat. No. 5,727,915, for actuating the flexible arms of the microgripper system.

The present invention intends to provide a microgripper device including a microactuator member adapted to directly actuate a microgripper member. The microgripper member comprising an engaging portion, a pair of lateral shifting portions and a gripping portion, and a longitudinal forward or backward movement of the engaging portion is able to actuate the lateral shifting portions for an expanding or returning operation. Thereby, the lateral shifting portions actuate the gripping portion to generate a gripping or releasing movement in such a way to mitigate and overcome the above problem.

SUMMARY OF THE INVENTION

The primary objective of this invention is to provide microgripper device including a microactuator member directly actuating a microgripper member. In particular, the microgripper member is integrated with an engaging portion, a pair of lateral shifting portions and a gripping portion to form a one-piece member, thereby simplifying the entire structure of the microgripper member.

The secondary objective of this invention is to provide the microgripper device including a microactuator member directly actuating a microgripper member provided with a gripping portion. Furthermore, the gripping portion includes a pair of pivot portions for permitting a gripping movement of the gripping portion, thereby simplifying the gripping operation of the microgripper member.

The microgripper device in accordance with the present invention includes a microactuator member and a microgripper member. The microactuator member includes an actuating portion adapted to output a driving force to the microgripper member for simplifying a gripping and releasing operation. The microgripper member includes a main frame, an engaging portion, a pair of lateral shifting portions and a gripping portion for simplifying the entire structure of the microgripper member. The main frame of the microgripper member mounts the microactuator member therein, and the engaging portion of the microgripper member connects to the actuating portion of the microactuating member. Each of the lateral shifting portions includes three connection portions linking the main frame, the engaging portion and the gripping respectively, thereby permitting an interconnected relationship. The gripping portion of the microgripper member includes a pair of resilient arms and a pair of pivot portions. And, each of the pivot portions connects to a first end of the corresponding resilient arm so that the second ends of the resilient arms are able to generate a gripping movement.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings wherein.

DETAILED DESCRIPTION OF THE INVENTION

Figure 1:
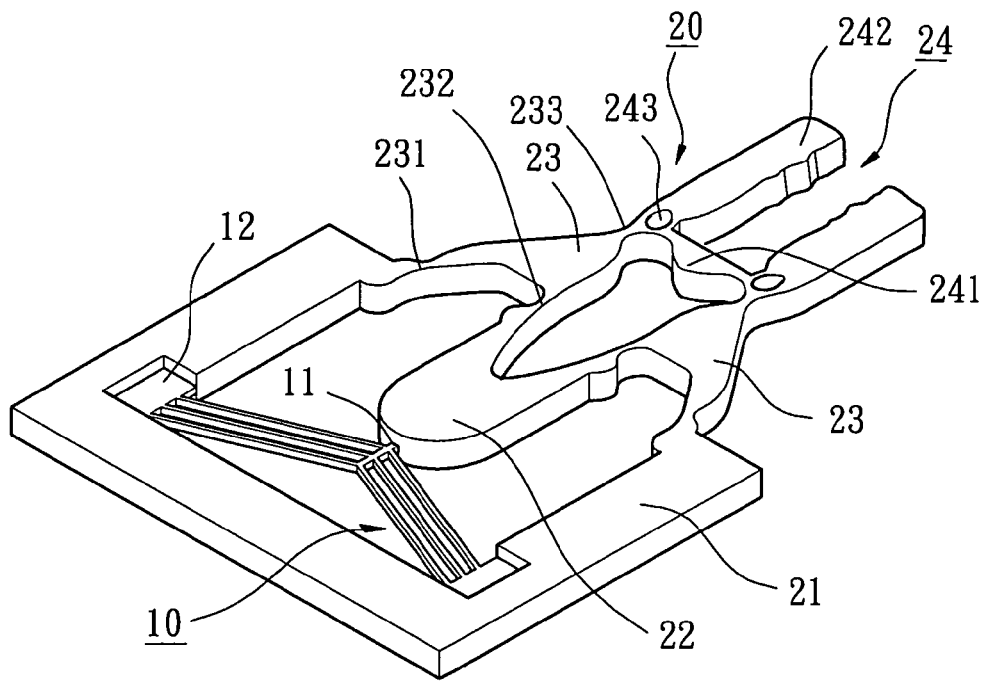
FIG. 1 is a perspective view of a microgripper device for a micro-mechanism in accordance with a preferred embodiment of the present invention.

Referring initially to FIG. 1, it depicts a microgripper device for a micro-mechanism in accordance with the present invention. The microgripper device generally includes an actuator member designated numeral 10, and a gripper member designated numeral 20.

Still referring to FIG. 1, the microgripper device for the micro-mechanism in accordance with the present invention includes a microactuator member 10, and a microgripper member 20. The microgripper member 20 accommodates the microactuator member 10 so that the microactuator member 10 is able to directly actuate the microgripper member 20, thereby generating a gripping or releasing operation of the microgripper member 20.

Figure 2:
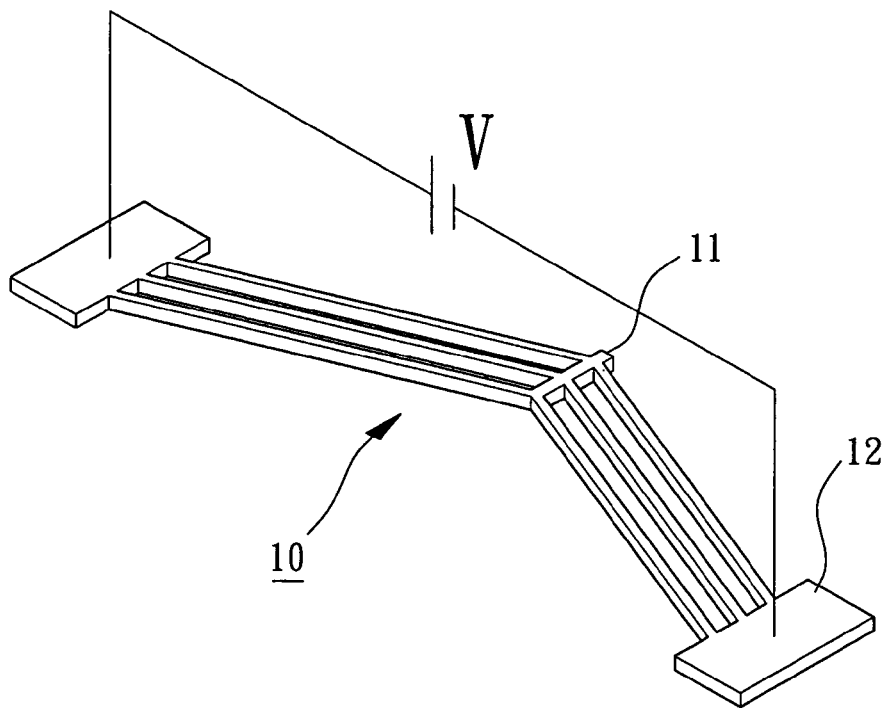
FIG. 2 is a perspective view of a microactuator member of the microgripper device for the micro-mechanism in accordance with the preferred embodiment of the present invention.

Turning now to FIG. 2, it depicts the construction of the microactuator member 10 which shall be described in detail.

Referring again to FIGS. 1 and 2, the microactuator member 10 is made of polysilicon material and has a predetermined thermal expansion coefficient that permits generating the deformation of the microactuator member 10. In structure, the construction of the microactuator member 10 is a V-shaped member symmetrically arranged along a longitudinal direction. In longitudinal direction, an end of the microactuator member 10 is provided with an actuating portion 11 to output a driving force to the microgripper member 20. Further, the microactuator member 10 includes a pair of lateral plates 12 to constitute the V-shaped member, and each of the lateral plates 12 disposes on either side of the actuating portion 11 with respect to the longitudinal direction. The lateral plates 12 are used to combine with the microgripper member 20 so that the microactuator member 10 is contained in the microgripper member 20. In addition, the microactuator member 10 electrically connects to a voltage source or a power source (shown at "V") so that it supplies the microactuator member 10 with electric energy or kinematic energy, as best shown in FIG. 2.

Still referring to FIG. 2, when the power source supplies the lateral plates 12 of the microactuator 10 with electric energy, the actuating portion 11 of the microactuator 10 is deformed due to its structural expansion and thus moved forward a predetermined distance along the longitudinal direction. Contrarily, when the power source is disconnected from the lateral plates 12 of the microactuator 10, the actuating portion 11 of the microactuator 10 is returned and thus moved backward a return distance along the longitudinal direction.

Referring back to FIG. 1, the construction of the microgripper member 20 shall be described in detail. The microgripper member 20 includes a main frame 21, an engaging portion 22, a pair of lateral shifting portions 23 and a gripping portion 24 which are arranged symmetrical along a longitudinal direction. Thereby, the movement of the microgripper member 20 can be balanced along the longitudinal direction.

Still referring to FIG. 1, the main frame 21 of the microgripper member 20 forms a C-shaped member adapted to accommodate the microactuator member 10 and the engaging portion 22. Basically, the structure of the main frame 21 is relatively rigid and strong to withstand normal operation of the microactuator member 10 in order to avoid any mechanical deformation of the microgripper member 20. Accordingly, a precise gripping operation of the microgripper member 20 is insured. Meanwhile, the main frame 21 of the microgripper member 20 permits either forward or backward movement of the microactuator member 10 and the engaging portion 22 of the microgripper member 20 along the longitudinal direction.

Still referring to FIG. 1, in assembling, the engaging portion 22 of the microgripping member 20 is engaged with the actuating portion 11 of the microactuator member 10 so that the movement of the microactuator member 10 is able to drive the microgripper member 20 for a gripping operation. Namely, any movement of the actuating portion 11 of the microactuator member 10 causes a synchronous movement of the engaging portion 22 of the microgripping member 20. Also, the synchronous movement of the engaging portion 22 may cause further movements of the lateral shifting portions 23 and the gripping portion 24 of the microgripper member 20.

Still referring to FIG. 1, each of the lateral shifting portions 23 includes a first connection portion 231, a second connection portion 232 and a third connection portion 233 linking the main frame 21, the engaging portion 22 and the gripping 24 respectively, thereby permitting an interconnected relationship. The first connection portion 231, the second connection portion 232 and the third connection portion 233 are spaced apart on a periphery of the lateral shifting portion 23. Thus, the energy input from the engaging portion 22 is transferred to the gripping portion 24.

Still referring to FIG. 1, the gripping portion 24 is located at an end of the microgripper member 20 and adapted to generate a gripping or releasing operation. The gripping portion 24 consists of a supporting base 241, a pair of resilient arms 242 and a pair of pivot portions 243. The supporting base 241 is laterally extended with respect to the longitudinal direction, and includes two ends connecting with the third connection portion 233 of the lateral shifting portion 23. Each of the two ends of the supporting base 241 further connects to the corresponding resilient arm 242 and the corresponding pivot portion 243 to thereby generate the gripping and releasing operation.

Figure 3:
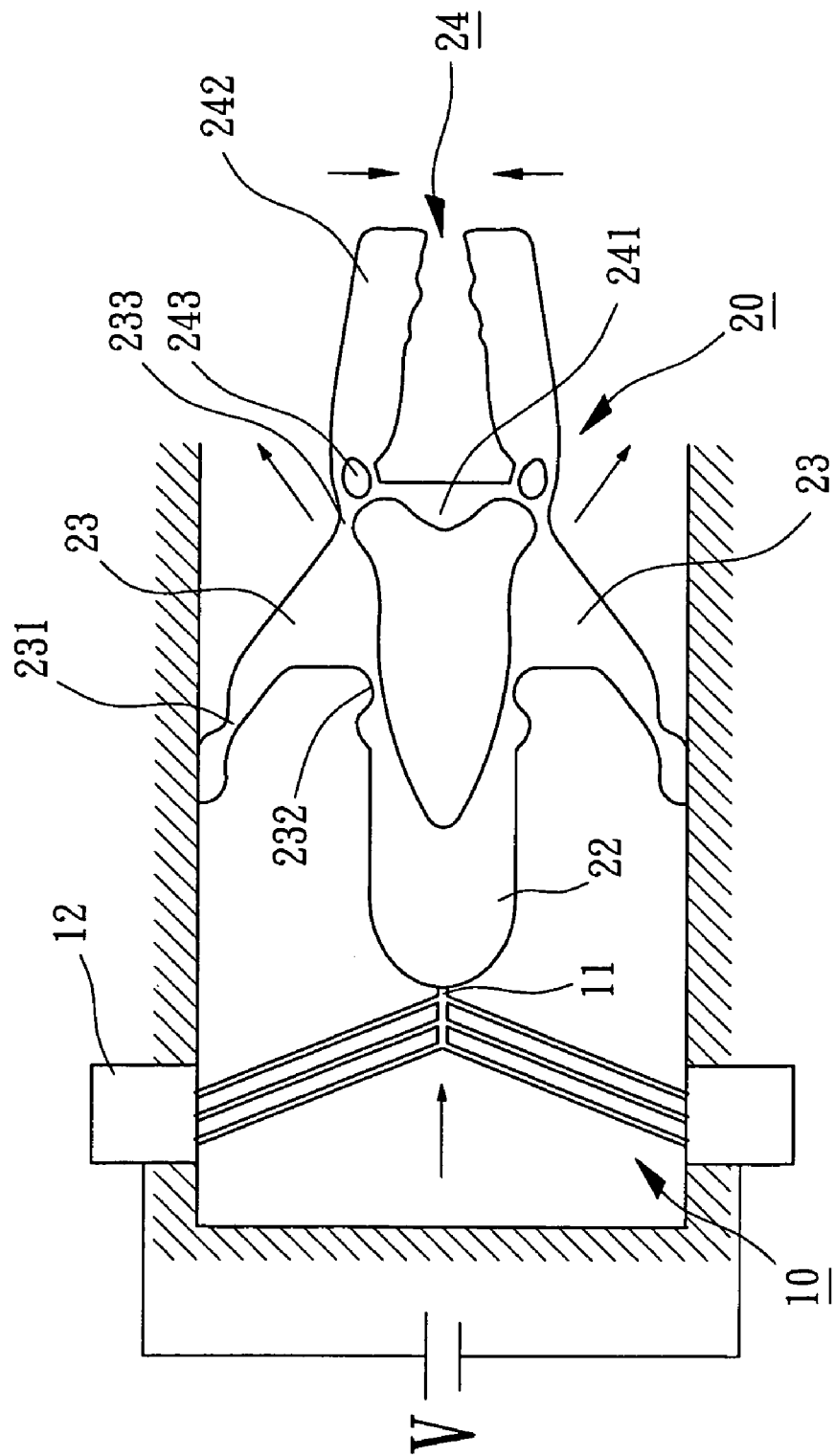
FIG. 3 is a top plan view of the microgripper device, in gripping operation, for a micro-mechanism in accordance with the preferred embodiment of the present invention.

Turning now to FIG. 3, it depicts the microgripper member 20 in gripping operation for gripping a very small object.

Referring to FIG. 3, in gripping operation, the actuating portion 11 of the microactuator member 10 is initially deformed and thus moved forward a predetermined longitudinal distance, as represented by arrow in FIG. 3. Synchronously, the actuating portion 11 of the microactuator member 10 actuates a predetermined longitudinal distance of the engaging portion 22 of the microgripper member 20.

Referring back to FIGS. 1 and 3, each of the first connection portion 231 of the lateral shifting portion 23 connects to an inner edge of the main frame 21 that allows the lateral shifting portion 23 to relatively move within a predetermined range. Also, each of the second connection portion 232 of the lateral shifting portion 23 connects to the engaging portion 22 that allows the engaging portion 22 to actuate the lateral shifting portion 23. Subsequently, when the engaging portion 22 moves forward a predetermined longitudinal distance, the two lateral shifting portions 23 are expanded (stretched), as represented by arrows in FIG. 3. Once the two lateral shifting portions 23 are expanded (stretched), it causes a shearing stress on the corresponding pivot portion 243 connected to the two ends of the supporting base 241. Accordingly, the two pivot portions 243 of the gripping portion 24 are rotated. At that time, each of the pivot portions 243 connects to the corresponding resilient arm 242. Consequently, the pivot portions 243 drive the resilient arm 242 to incline to a longitudinal line, as represented by arrow in FIG. 3, for generating a gripping operation.

In releasing operation, when the actuating portion 11 of the microgripping member 10 is returned, the actuating portion 11 moves a predetermined longitudinal distance. Accordingly, it removes an actuating force of the actuating portion 11 of the microactuator member 10 to the microactuator member 20.

Subsequently, once the lateral shifting portions 23 is returned, it removes a shearing stress of the lateral shifting portions 23 connected to the supporting base 241. Accordingly, the lateral shifting portions 23 is rotated in an opposite direction. Consequently, the lateral shifting portions 23 actuate the resilient arms 242 for a releasing operation.

Figure 4:
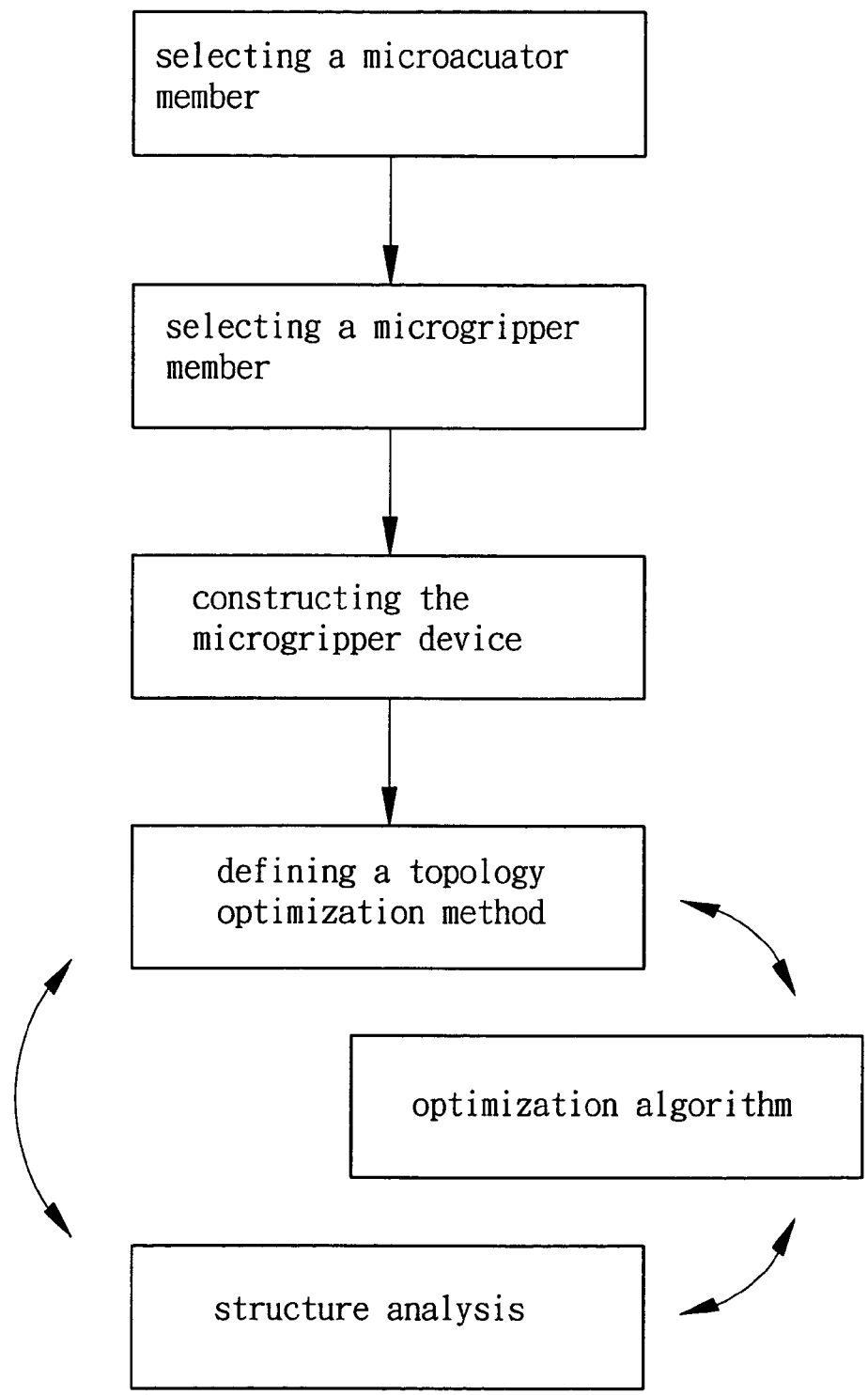
FIG. 4 is a block diagram of a manufacturing method for the microgripper device for the micro-mechanism in accordance with the preferred embodiment of the present invention.

Turning now to FIG. 4, it depicts diagrammatic blocks of a manufacturing method for the microgripper device in accordance with the present invention, and substantially includes four operating steps.

Referring to FIG. 4, the manufacturing method for the microgripper device, in first step, initially selects a microactuator member and a microgripper member. As best shown in FIG. 1, selecting structure, material and characteristic of the microactuator member 10 and the microgripper member 20.

Referring again to FIGS. 1 and 4, the manufacturing method for the microgripper device, in second step, employs connecting means for combining the microactuator member 10 with the microgripper member 20. However, there is a need for deciding basic connection portions between the microactuator member 10 and the microgripper member 20 to construct the microgripper device.

Still referring to FIGS. 1 and 4, the manufacturing method for the microgripper device, in third step, defines a topology optimization method for the microactuator member 10 and the microgripper member 20. In this step, the microgripper device is defined a design domain including domain scale, boundary conditions and load location for carrying out an optimized operation.

Still referring to FIGS. 1 and 4, the manufacturing method for the microgripper device, in final step, calculates an optimization model. In this step, it is proceeded with optimization algorithm and structure analysis to obtain the optimization model of the microactuator member 10 and the microgripper member 20.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A microgripper device for a micro-mechanism, comprising:
   a microactuator member being a V-shaped member symmetrically arranged about a longitudinal direction of the microgripper device, an end of the microactuator member provided with an actuating portion to output a driving force; and
   a microgripper member including a main frame, an engaging portion, a pair of lateral shifting portions and a gripping portion which are arranged along the longitudinal direction, the main frame accommodating the microactuator member while the engaging portion engaging with the microactuator, each of the lateral shifting portions linking the main frame, the engaging portion and the gripping portion to constitute an interconnected relationship;
   wherein the microgripper member is used to generate a gripping or releasing movement, when the driving force of the microactuator member actuates the engaging portion of the microgripper member, the gripping portion of the microgripper member generates the gripping movement;
   wherein when the driving force of the microactuator member is removed from the engaging portion of the microgripper member, the gripping portion of the microgripper member generates the releasing movement.

2. The microgripper device for the micro-mechanism as defined in claim 1, wherein the microactuator member includes a pair of lateral plates, and each of the lateral plates is symmetrically arranged on either side of the microactuator member with respect to a longitudinal direction.

3. The microgripper device for the micro-mechanism as defined in claim 1, wherein each of the lateral shifting portions connects to an inner edge of the main frame.

4. The microgripper device for the micro-mechanism as defined in claim 1, wherein the gripping portion includes a pair of resilient arms and a pair of pivot portions, each of the resilient arms connecting to the corresponding pivot portion to thereby generate the gripping and releasing movement.

5. A microgripper device for a micro-mechanism, comprising:
   a microactuator member adapted to output a driving force; and
   a microgripper member including a main frame, an engaging portion, a pair of lateral shifting portions and a gripping portion which are arranged along a longitudinal direction, the main frame accommodating the microactuator member while the engaging portion engaging with the microactuator, each of the lateral shifting portions linking the main frame, the engaging portion and the gripping portion to constitute an interconnected relationship;
   the gripping portion consisting of a supporting base, a pair of resilient arms and a pair of pivot portions; the supporting base being laterally extended with respect to a longitudinal direction, and including two ends connecting with the lateral shifting portion, the two ends of the supporting base further connecting with the corresponding resilient arm and the corresponding pivot portions;
   wherein the microgripper member is used to generate a gripping or releasing movement, when the driving force of the microactuator member actuates the engaging portion of the microgripper member, the gripping portion of the microgripper member generates the gripping movement
   wherein when the driving force of the microactuator member is removed from the engaging portion of the microgripper member, the gripping portion of the microgripper member generates the releasing movement.

6. The microgripper device for the micro-mechanism as defined in claim 5, wherein the microactuator member includes an actuating portion adapted to output the driving force to the microgripper member.

7. The microgripper device for the micro-mechanism as defined in claim 5, wherein the microactuator member is a V-shaped member symmetrically arranged about the longitudinal direction; an end of the microactuator member provided with an actuating portion to output the driving force to the microgripper member.

8. The microgripper device for the micro-mechanism as defined in claim 5, wherein the microactuator member includes a pair of lateral plates, and each of the lateral plates is symmetrically arranged on either side of the microactuator member with respect to a longitudinal direction.

9. The microgripper device for the micro-mechanism as defined in claim 5, wherein each of the lateral shifting portions connects to an inner edge of the main frame.

* * * * *